(12) United States Patent
Montgomery et al.

(10) Patent No.: US 11,038,150 B1
(45) Date of Patent: Jun. 15, 2021

(54) QLED/OLED PIXEL HAVING REFLECTIVE CAVITY ELECTRODE CONFIGURATION

(71) Applicant: Sharp Kabushiki Kaisha, Osaka (JP)

(72) Inventors: David James Montgomery, Oxford (GB); Tim Michael Smeeton, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 16/777,259

(22) Filed: Jan. 30, 2020

(51) Int. Cl.
*H01L 51/52* (2006.01)
*H01L 33/60* (2010.01)

(52) U.S. Cl.
CPC .......... *H01L 51/5271* (2013.01); *H01L 33/60* (2013.01); *H01L 51/5265* (2013.01)

(58) Field of Classification Search
CPC .................... H01L 51/5265; H01L 51/5271
See application file for complete search history.

(56) References Cited

U.S. PATENT DOCUMENTS

| | | | |
|---|---|---|---|
| 7,091,658 B2 | 8/2006 | Ito et al. | |
| 7,902,750 B2 | 3/2011 | Takei et al. | |
| 7,973,470 B2 | 7/2011 | Cok | |
| 8,207,668 B2 | 6/2012 | Cok et al. | |
| 8,894,243 B2 | 11/2014 | Cho et al. | |
| 9,029,843 B2 | 5/2015 | Harada et al. | |
| 9,123,675 B2 | 9/2015 | Kim et al. | |
| 9,312,519 B2 | 4/2016 | Yamamoto | |
| 9,583,727 B2 | 2/2017 | Cho et al. | |
| 1,009,048 A1 | 10/2018 | Uchida et al. | |
| 2006/0158098 A1 | 6/2006 | Raychaudhuri et al. | |

(Continued)

FOREIGN PATENT DOCUMENTS

| CN | 106876566 | 6/2017 |
|---|---|---|
| KR | 20150020140 | 2/2015 |
| WO | 2017205174 | 11/2017 |

*Primary Examiner* — Zandra V Smith
*Assistant Examiner* — Molly K Reida
(74) *Attorney, Agent, or Firm* — Renner, Otto, Boisselle & Sklar, LLP (57) ABSTRACT

A light-emitting device has enhanced light output by employing a reflective optical cavity along the bank structure to improve light extraction. The light-emitting device includes a bank structure; an emissive cavity disposed within the bank structure; a filler material layer disposed within the bank structure and on a light-emitting side of the emissive cavity; and a reflective optical cavity disposed along an inner surface of the bank structure facing the filler material layer. The reflective optical cavity is configured to out-couple light that is internally reflected by an emitting side surface of the filler material layer and is incident on the reflective optical cavity. The reflective optical cavity incudes a first conductive layer and a second conductive layer that are separated by a non-conductive dielectric layer. The first conductive layer is disposed against the inner surface of the bank structure, and the second conductive layer is disposed against the filler material layer opposite from the inner surface of the bank structure. The emissive cavity includes an emissive layer disposed between a first electrode layer and a second electrode layer, and the first conductive layer may be configured as an extension of the first electrode layer and the second conductive layer may be configured as an extension of the second electrode layer.

17 Claims, 8 Drawing Sheets

(56) References Cited

U.S. PATENT DOCUMENTS

2012/0147299 A1* 6/2012 Park ................. G02F 1/133502
                                                              349/96
2015/0084012 A1   3/2015 Kim et al.
2017/0133443 A1* 5/2017 Nendai ................... H01L 51/56
2020/0194713 A1* 6/2020 Kim .................... H01L 27/3258

* cited by examiner

Fig. 1

Related Art

QLED/OLED PIXEL HAVING REFLECTIVE CAVITY ELECTRODE CONFIGURATION

TECHNICAL FIELD

The present application relates to a layer and bank structure used for an emissive device, in particular for a quantum dot light-emitting diode (QLED) or organic light-emitting diode (OLED) for a display device. In particular, embodiments of the present application improve efficiency, reduce color shift, and improve brightness for top-emitting light-emitting device structures embedded in a high refractive index encapsulate material surrounded by a bank structure.

BACKGROUND ART

There are a number of conventional configurations of organic light-emitting diode (OLED) and quantum dot light-emitting diode (QLED) structures that include optical cavities in the LED structure to generate a cavity effect for extraction of light. For example, US 2006/0158098 (Raychaudhuri et al., published Jul. 20, 2006) describes a top emitting structure, and U.S. Pat. No. 9,583,727 (Cho et al., issued Feb. 28, 2017) describes an OLED and QLED structure with light-emitting regions between reflective areas, one of which is partially transmitting to emit light. Methods for improving the luminance of such optical cavities, for example US 2015/0084012 (Kim et al., published Mar. 26, 2015), include the use of dispersive layers in an OLED structure. Other examples include U.S. Pat. No. 8,894,243 (Cho et al., issued Nov. 25, 2014), which describes the use of microstructure scattering for improving efficiency, and WO 2017/205174 (Freier et al., published Nov. 30, 2017), which describes enhancement of the light emission by use of surface plasmon nanoparticles or nanostructures in the charge transport layers.

Methods such as referenced above that involve modifications to the cavity structure are often difficult to implement, as such methods require very small size features or precise control of layers. One alternative to modifying the cavity is to use a thick top "filler" layer with a relatively high refractive index, which enables Fresnel reflections to be reduced and transmissivity through a top electrode to be increased. The light traveling through the high refractive index layer, however, largely will be trapped by total internal reflection (TIR). TIR happens when light that propagates in a first dielectric meets an interface with a second dielectric of lower refractive index at such an angle to the normal to the interface that no propagation in the second dielectric is possible from the laws of electromagnetism (Snell's Law). In this case, the light is reflected according to normal reflection laws with 100% efficiency and is considered to be "totally internally reflected". Light can then be trapped as the light propagates between parallel surfaces without exiting before the light is absorbed or disrupted by some other means. To extract light that encounters TIR, reflective and/or scattering bank structures often are used surrounding the filler layer to out-couple light that otherwise would be trapped by TIR.

CN 106876566 (Chen et al., published Jun. 20, 2017) and U.S. Pat. No. 9,029,843 (Harada et al., issued May 12, 2015) describe such a pixel arrangement with banks and a filler material above the organic layers of the cavity and between the banks. U.S. Pat. No. 7,091,658 (Ito et al., issued Aug. 15, 2006) describes banks that can be reflective using an electrode metallic material, and KR 20150020140 (Cambridge Display Tech) describes banks that can be shaped in different structures using different assembly steps. U.S. Pat. No. 10,090,489 (Uchida et al., issued Oct. 2, 2018) describes a shaped reflector underneath the organic layers. A particular filler layer structure also can be selected, such as described for example in U.S. Pat. No. 8,207,668 (Cok et al., issued Jun. 26, 2012), in which the fillers and organic layers have different thicknesses for different sub-pixels to maximize the light output as a function of wavelength.

Control of the organic layer output also can be achieved by appropriate material choices (e.g. lyophilic/Lyophobic) or other structural modifications. For example, U.S. Pat. No. 7,902,750 (Takei et al., issued Mar. 8, 2011) describes cavity layers that are curved and the encapsulation layer is a planarizing layer, and U.S. Pat. No. 9,312,519 (Yamamoto, issued Apr. 12, 2016) describes organic layers that are both convex and concave in orthogonal directions.

SUMMARY OF INVENTION

Embodiments of the present application pertain to designs for an emissive display including light-emitting devices, such as a quantum dot electro-emissive material, in an LED arrangement. This arrangement typically includes a layer of a quantum dot (QD) emissive material sandwiched between multiple charge transport layers (CTLs), including an electron transport layer (ETL) and a hole transport layer (HTL). This stack is then sandwiched between two conductive electrode layers, one side of which is formed on a substrate. Embodiments of the present application specifically relate to "top emitting" (TE) structures, in which light emission is from the side of the device stack opposite from the substrate.

As referenced above, prior attempts to enhance light output of such devices often have focused on modifying the structure of the optical cavity that includes the emissive layer and the charge transport layers. Such attempts, however, have not addressed the problem of total internal reflection (TIR) experienced by a significant portion of light due to the high refractive index of the filler encapsulation layer that is above the optical cavity. In conventional configurations, the light subjected to TIR essentially is lost.

Embodiments of the present application improve light output by reconfiguring the electrode configuration as compared to conventional configurations to improve light extraction of light that otherwise would be lost due to TIR. In embodiments of the present application, multiple reflective layers, e.g., metal layers, are disposed on the bank structure slope, with the reflective layers being separated by an appropriate non-conductive dielectric layer, such as for example a layer of silicon dioxide (e.g. $SiO_2$). The use of two reflective layers is used in exemplary embodiments, and each reflective layer may be configured as an extension of a respective conductive electrode layer of the emissive cavity structure. The electrode layers of the emissive cavity structure may be extended along a sloping direction of an inner surface of the bank structure that faces the filler material layer. The resultant configuration forms a reflective optical cavity structure that can be controlled in shape and/or thickness to maximize out-coupling of the light that otherwise would be trapped by TIR. The reflective optical cavity structure can be thickened relative to a thickness of the emissive cavity structure to reduce additional capacitance. Advantages of embodiments of the present application include increased light extraction from the emissive cavity structure of the light-emitting device and higher tolerance for the design of the emissive cavity.

An aspect of the invention, therefore, is a light-emitting device that has enhanced light output by employing a reflective optical cavity along the bank structure to improve light extraction. In exemplary embodiments, the light-emitting device includes a bank structure; an emissive cavity disposed within the bank structure; a filler material layer disposed within the bank structure and on a light-emitting side of the emissive cavity; and a reflective optical cavity disposed along an inner surface of the bank structure facing the filler material layer. The reflective optical cavity is configured to out-couple light that is internally reflected by an emitting side surface of the filler material layer and is incident on the reflective optical cavity.

In exemplary embodiments, the reflective optical cavity incudes a first conductive layer and a second conductive layer that are separated by a non-conductive dielectric layer. The first conductive layer is disposed against the inner surface of the bank structure, and the second conductive layer is disposed against the filler material layer opposite from the inner surface of the bank structure. The emissive cavity includes an emissive layer disposed between a first electrode layer and a second electrode layer, and the first conductive layer may be configured as an extension of the first electrode layer and the second conductive layer may be configured as an extension of the second electrode layer.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DESCRIPTION OF EMBODIMENTS

Embodiments of the present application will now be described with reference to the drawings, wherein like reference numerals are used to refer to like elements throughout. It will be understood that the figures are not necessarily to scale.

Figure 1:
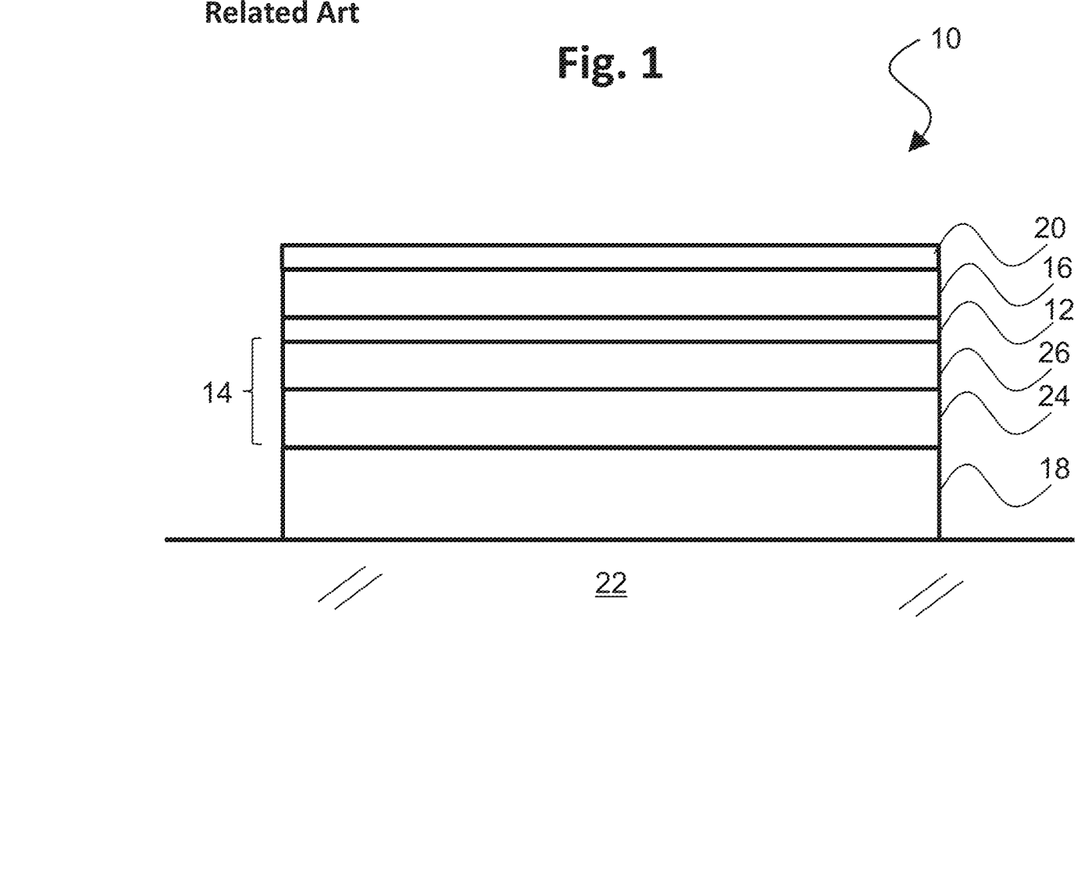
FIG. 1 is a drawing depicting an example of a conventional cavity structure for a top emitting light-emitting device.

FIG. 1 is a drawing depicting an example of a conventional cavity structure 10 for a top emitting light-emitting device. Embodiments of the present application pertain to designs for an emissive display involving a quantum dot electro-emissive material in an LED arrangement (QLED). Although the description largely is in the context of QLED light-emitting devices, principles of the present application are not limited to such devices and also are applicable to other types of light-emitting devices, such as for example organic light-emitting (OLED) devices. Accordingly, for purposes of this application description as to QLED devices applies equally to OLED devices (unless otherwise stated specifically), and vice versa.

A top-emitting arrangement such as corresponding to the light-emitting device 10 includes an emissive layer 12 that includes a quantum dot (QD) or other suitable emissive material. The emissive layer 12 is sandwiched between multiple charge transport layers (CTLs), including a hole transport layer (HTL) 14 and an electron transport layer (ETL) 16. This stack is then sandwiched between first and second conductive electrode layers 18 and 20, one side of which is grown on a glass substrate 22. Embodiments of the present application specifically relate to "top emitting" (TE) structures, in which light emission is from the side of the device stack opposite from the glass substrate layer. Substrate materials may be used other than glass, such as for example various plastic materials (e.g., polyimide, polycarbonate or polymethyl methacrylate for example).

In the example of FIG. 1, based on typical fabrication processes for TE devices such as the light-emitting device 10, in one exemplary structure the first conductive electrode layer 18 is a relatively thick reflective and electrically conductive layer, e.g. greater than 80 nm, such as silver or aluminium, deposited on a substrate 22. A further layer of another conducting metallic or non-metallic (e.g. indium tin oxide (ITO)) material may be added on the metal layer as part of the first conducting layer 18. An HTL layer 14 is deposited on the thick conductive electrode layer 18. In a TE device, the thick conductive layer 18 is reflective to direct light toward the top of the stack for light emission opposite from the substrate side. The ETL side second conductive electrode layer 20 is a relatively thin conductive layer as compared to the HTL side conductive electrode layer 18. The second electrode layer 20, therefore, is thick enough to carry sufficient current, but thin enough to be transparent to the light emission. Suitable materials for the second electrode layer 20 include, for example, silver or a magnesium-silver alloy, ITO and Zn doped ITO.

A typical ETL layer 16 material includes Zinc Oxide (ZnO) nanoparticles, and a typical HTL layer 14 is a dual layer including a first HTL component layer 24 of PEDOT: PSS (poly(3,4-ethylenedioxythiophene) polystyrene sulfonate) deposited on the reflective first electrode layer 18, and a second HTL component layer 26 of TFB [poly(9,9'-dioctylfluorene-co-bis-N,N-(4-butylphenyl)diphenylamine)] located between the PEDOT layer 24 and the emissive layer 12. It will be appreciated that the ETL and HTL layers can be reversed with the ETL on the substrate side and the HTL on the non-substrate side relative to the emissive layer 12, and the principles of the present application also apply to such an inverted structure as well. Accordingly, the ETL and HTL more generally may be referred to as charge transport layers (CTLs).

Figure 2:
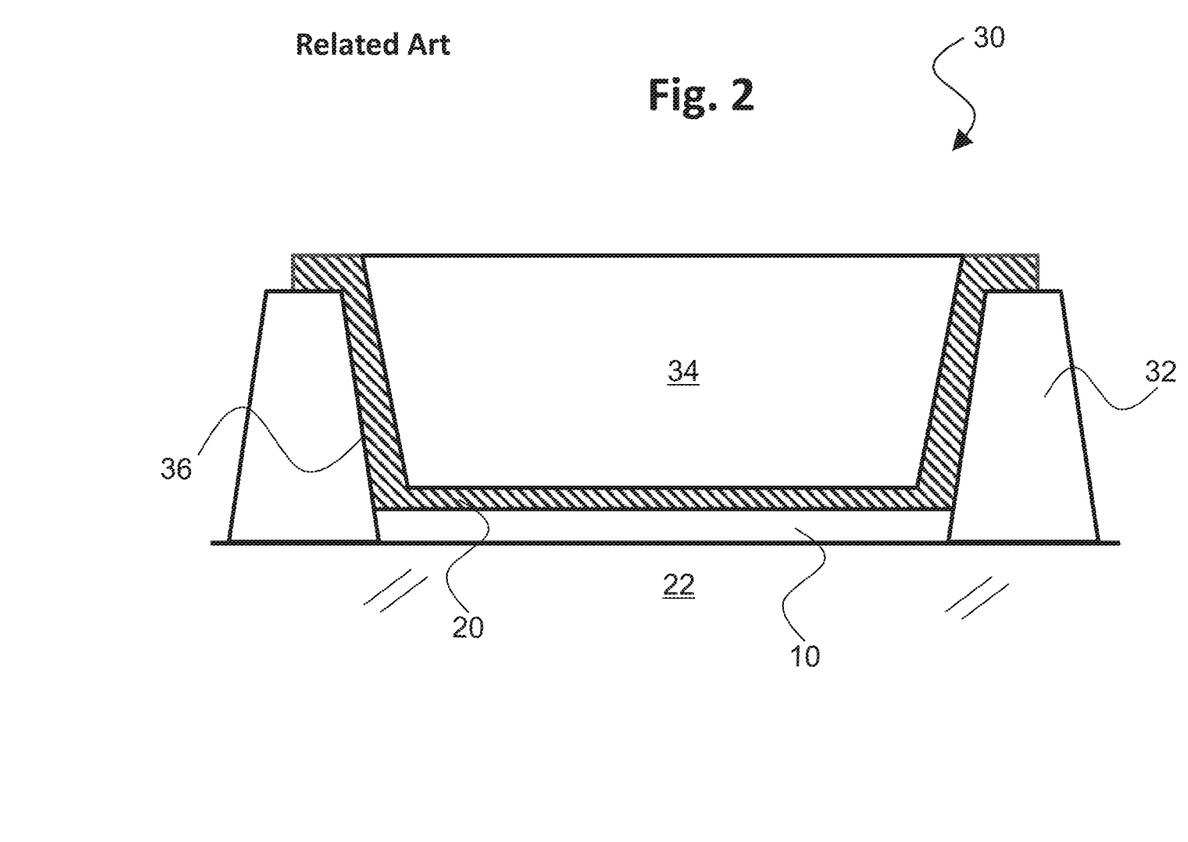
FIG. 2 is a drawing depicting an example of a conventional light-emitting device structure for a pixel that includes the cavity structure of FIG. 1.

FIG. 2 is a drawing depicting an example of a conventional light-emitting device structure 30 for a pixel that includes the cavity structure 10 of FIG. 1. The exemplary pixel structure 30 includes the emissive cavity layers 10 deposited on the substrate 22 and confined within a bank structure 32 that is disposed around or about a perimeter of the emissive cavity and constitutes a barrier of the pixel 30 on the substrate relative to adjacent pixels. In this depiction, the second or top electrode layer 20 is depicted separately from the other layers of the emissive cavity 10 for illustrative purposes.

The space above the emissive cavity layers 10 within the bank structure 32 is filled with a filler or encapsulate material layer 34 used to protect the emissive cavity layer 10. The filler material layer 34 also extracts light from the emissive cavity to a greater extent than air would do, due to a higher refractive index. Light trapped in the emissive cavity layers 10 is quickly absorbed, but light trapped in the thicker filler layer 34 has the chance to propagate to the bank edges and can be extracted from the pixel by reflection off the bank structure. The bank structure 32 may or may not be opaque and the bank inner surface 36 that faces towards the filler material can be scattering or specular reflective by providing a coating. In exemplary embodiments, the bank inner surface 36 that faces towards the filler material layer 34 is made reflective by extending the second (top) electrode layer 20 over the bank structure 32 along the inner surface 36. The second electrode layer 20 in addition may be further extended across an array of pixels, up to pixels of the entire display device, to act as a common electrode for the pixels. The extension of the electrode layer 20 improves light extraction by rendering the inner surface 36 of the bank structure 32 reflective, but a significant amount of light still is lost to TIR within the filler material layer 34. Above the filler layer 34 is typically air or a low refractive index material to prevent light from leaking into the neighbouring pixels and creating cross-talk.

More specifically, in QLED or OLED pixels or sub-pixels exemplified in FIG. 2 by the light-emitting device 30, the cavity structure 10 is enclosed within a bank structure 32 that is positioned adjacent to a filler material 34 of a relatively high refractive index of typically above 1.5 (e.g., 1.5-2.5). The thickness of the bank structure 32 in a direction perpendicular to the cavity structure 10 tends to be about 1-10 microns and will depend upon the desired thickness of the filler material in said direction perpendicular to the cavity structure 10. The bank structure 32 may be formed of a photoresist material, such as polyamide, grown on the substrate 22 to form barriers that separate adjacent pixels, and has a scattering or specular reflective surface 36 facing the filler material layer 34. As referenced above, in exemplary embodiments the bank structure inner surface 36 that faces towards the filler material layer 34 is made reflective by extending the second (top) electrode layer 20 over the bank structure 32 along the surface 36. The filler material 34 may be made of any suitable high-refractive index material, i.e., having a refractive index generally above 1.5 and typically 1.5-2.5. A typical way to form patternable high refractive index materials for the filler material is: monomer(s)+high refractive index inorganic nanoparticle+photoinitiator (optional). The monomers may be a -thiol plus another group, for example an -ene or an -yne, or other suitable polymers. The high refractive index nanoparticles may be oxide nanoparticles, such as for example titanium oxide ($TiO_2$) and zinc oxide (ZnO). Parylene C [a.k.a. poly(p-xylylene)] has been used as an OLED encapsulant.

The higher refractive index filler material 34 extracts more light from the emissive cavity 10 than if air is directly above the emissive cavity 10. An air gap (or other suitable low refractive index layer) is present over the filler material 34 to prevent optical crosstalk by preventing light from being coupled in a top glass substrate layer (not shown in FIG. 2) to the neighboring pixels. This air gap does trap light in the filler material which is more readily absorbed. A purpose of embodiments of the present application is to extract light more effectively from the filler material 34 without coupling the extracted light into the upper glass substrate layer and then to neighboring pixels.

As referenced above, prior attempts to enhance light output of such devices often have focused on modifying the structure of the optical cavity that includes the emissive layer and the charge transport layers. Such attempts, however, have not addressed the problem of total internal reflection (TIR) experienced by a significant portion of light due to the high refractive index of the filler encapsulation layer that is above the optical cavity. In conventional configurations, the light subjected to TIR essentially is lost.

Embodiments of the present application improve light output by reconfiguring the electrode configuration as compared to conventional configurations to improve light extraction of light that otherwise would be lost due to TIR. In embodiments of the present application, multiple conductive layers, e.g., metal layers, are disposed along the bank structure, with the conductive layers being separated by an appropriate non-conductive dielectric layer, such as for example a layer of silicon dioxide (e.g. $SiO_2$). The use of two conductive layers is used in exemplary embodiments, and each conductive layer may be configured as an extension of a respective electrode layer of the emissive cavity structure. Alternatively, two or more conductive layers may be deposited within the bank structure in addition to the layers of the emissive cavity structure, interspersed with non-conductive dielectric material layers. The electrode layers of the emissive cavity structure may be extended along a sloping direction of an inner surface of the bank structure that faces the filler material layer.

The resultant configuration forms a reflective optical cavity structure that can be controlled in shape and/or thickness to maximize out-coupling of the light that otherwise would be trapped by TIR. The reflective optical cavity structure can be thickened relative to a thickness of the emissive cavity structure to reduce additional capacitance. Advantages of embodiments of the present application include increased light extraction from the emissive cavity structure of the light-emitting device and higher tolerance for the design of the emissive cavity.

Figure 3:
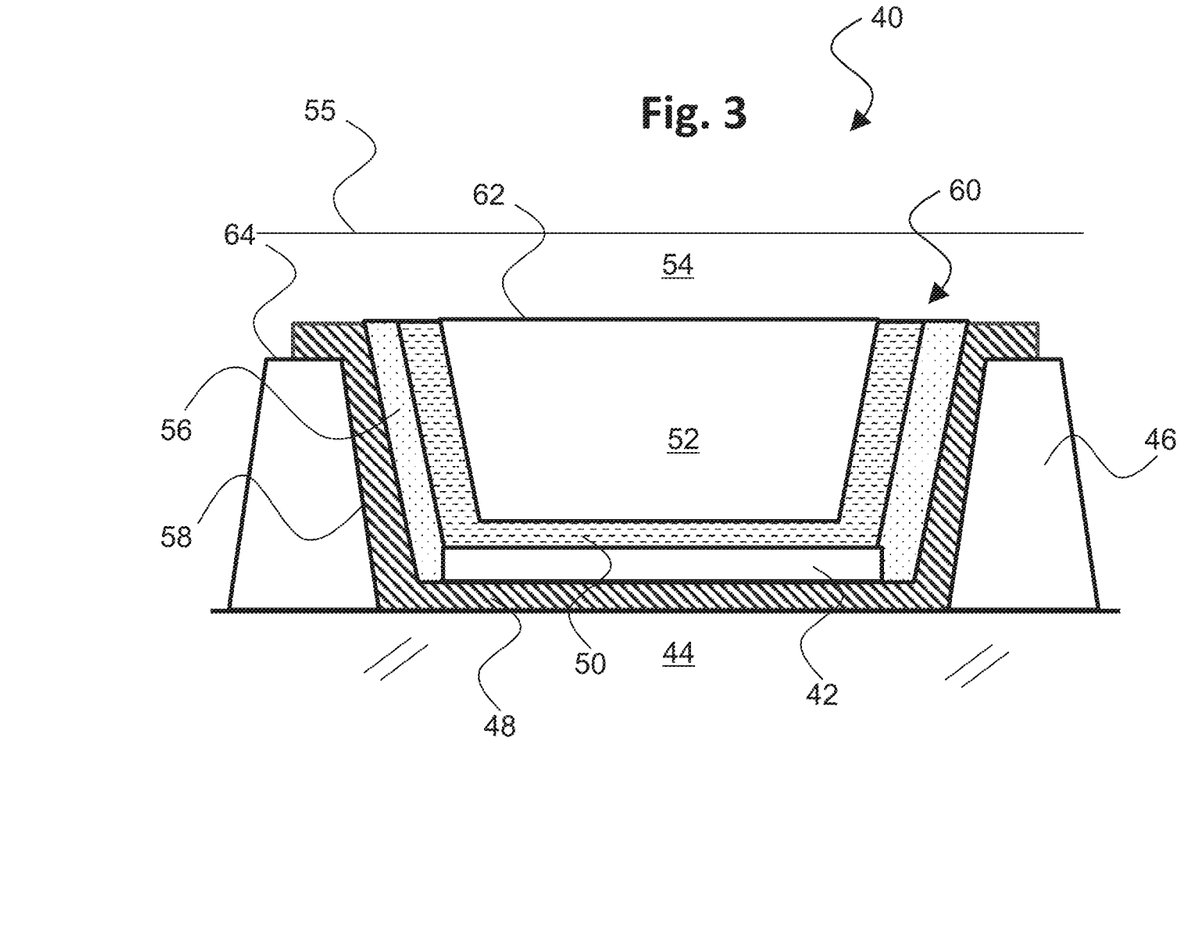
FIG. 3 is a drawing depicting an exemplary light-emitting device structure for a pixel in accordance with embodiments of the present application.

FIG. 3 is a drawing depicting an exemplary light-emitting device structure 40 for a pixel in accordance with embodiments of the present application. Similarly as in the conventional structure of FIG. 2, the exemplary pixel structure 40 includes an emissive cavity 42 disposed on a substrate 44 and disposed within a bank structure 46 that is positioned around or about the emissive cavity and constitutes a barrier of the pixel 40 on the substrate relative to adjacent pixels. The emissive cavity 42 may be configured in any suitable manner as is known in the art, such as described above for example in connection with FIG. 1. In exemplary embodiments, the emissive cavity 42 is a top emitting device that emits light in a direction opposite from the substrate 44.

In this particular depiction, the emissive cavity structure 42 more specifically includes an emissive layer and any suitable charge transport layers, such as described above with respect to FIG. 1. For purposes of illustrating embodiments of the present application, the electrode layers are depicted separately from the emissive cavity structure 42 having the emissive layer and charge transport layers. The light-emitting device structure 40, therefore, has a first (bottom) conductive electrode layer 48 deposited on the substrate 44, which as referenced above may be a conductive layer such as, for example, silver, aluminium, or indium tin oxide (ITO) or the like. The light-emitting device structure 40 further includes a second (top) conductive electrode layer 50 deposited on the emissive cavity structure 42 that is transparent to the light emission for a top emitting device. As referenced above, the second electrode layer 50 may be a conductive layer such as, for example, ITO, silver or a magnesium-silver alloy or the like.

The space above the second electrode layer 50 within the bank structure 46 is filled with a filler or encapsulate material layer 52 used to protect the emissive cavity 42. Accordingly, the filler material layer 52 is disposed within the bank structure 46 and on a light-emitting side of the emissive cavity 42. As detailed above, the filler material layer 52 also extracts light from the emissive cavity 42 to a greater extent than air would do, due to a higher refractive index. Above the filler material layer 52 is typically a low refractive index planarizing material layer 54, which may be air or an aero-gel, or other suitable low refractive index material having a refractive index of about 1.0-1.4. Examples may include siloxane based nano-composite polymers, which have a refractive index as low as 1.15. Other examples of the low refractive index material layer 54 may include Poly(1,1,1,3,3,3-hexafluoroisopropyl acrylate) with a refractive index of 1.375, and Poly(2,2,3,3,4,4,4-heptafluorobutyl acrylate) with a refractive index of 1.377. Generally, the planarizing material layer 54 has a refractive index that is less than a refractive index of the filler material layer 52.

Accordingly, similarly as in the conventional configuration, the filler material layer 52 is made of a relatively high refractive index material of typically at least 1.5 (e.g., 1.5-2.5). The materials used to form the bank structure 46 and filler material layer 52 may be the same or comparable as described above in connection with the conventional configuration. Again, the higher refractive index filler material layer 52 extracts more light from the emissive cavity 42 than if air was directly above the emissive cavity. The low refractive index planarizing material layer 54 is present over the filler material layer 52 to prevent optical crosstalk by preventing light from being coupled into a top or second glass substrate layer 55 that is disposed on the planarizing material layer, and then to the neighboring pixels.

As further detailed in the following, in embodiments of the present application a reflective optical cavity is disposed along an inner surface of the bank structure facing the filler material layer, wherein the reflective optical cavity is configured to out-couple light that is internally reflected by an emitting side surface of the filler material layer and is incident on the reflective optical cavity. In the exemplary embodiment of FIG. 3, the first and second conductive electrode layers 48 and 50 are separated by a non-conductive dielectric material layer 56 to form a reflective optical cavity 60. The non-conductive dielectric material layer 56 is a non-emissive layer, and may be formed as an extension of a non-emissive portion of the emissive cavity structure 42, such as an extension from a non-emissive charge transport later. Alternatively, the non-conductive dielectric material layer 56 may be a distinct layer deposited within the bank structure 46 and that is made of a different material from any of the layers of the emissive cavity structure. Suitable materials for the dielectric material layer 56 include silicon dioxide ($SiO_2$) and silicon nitride ($Si_3N_4$).

The three layers 48, 50, and 56 extend in a sloping direction along an inner surface 58 of the bank structure 46. The combination of the first and second conductive electrode layers 48 and 50, separated by a non-conductive dielectric material layer 56, forms a reflective cavity structure 60 that outputs light that is reflected toward the bank structure by an emitting side surface 62 (i.e., opposite from the substrate 44) of the filler material layer 52. The resultant configuration, therefore, forms a reflective cavity structure 60 that can be controlled in shape and/or thickness to maximize out-coupling of the light that otherwise would be trapped by TIR. In addition, although the conductive layers 48 and 50 of the reflective cavity structure 60 may be formed as extensions of the first and second electrode layers of the emissive cavity structure, such need not be the case. Alternatively, two or more reflective layers may be deposited within the bank structure in addition to the layers of the emissive cavity structure, interspersed with non-conductive dielectric material layers.

In general, therefore, the reflective optical cavity 60 includes a first conductive layer 48 and a second conductive layer 50 that are separated by a non-conductive dielectric layer 56. The first conductive layer is disposed against the inner surface 58 of the bank structure 46, and the second conductive layer is disposed against the filler material layer 52 opposite from the inner surface of the bank structure. The first conductive layer 48 may be configured as an extension of the first electrode layer of the emissive cavity, and the second conductive layer 50 may be configured as an extension of the second electrode layer of the emissive cavity.

In the example of FIG. 3, the first (bottom) electrode layer 48 extends over an emitting side surface 64 (i.e., opposite from the substrate 44) of the bank structure 46. The first electrode layer 48 also may be further extended across an array of pixels, up to pixels of the entire display device, to act as a common electrode for the pixels. In this example, the second (top) electrode layer 50 is localized within the bank structure 46 relative to adjacent pixels. The electrodes 48 and 50 extend onto the bank surface and generally have the same properties and thickness as above the emissive cavity 42, which constitutes a structure that is straightforward to fabricate.

Figure 4:
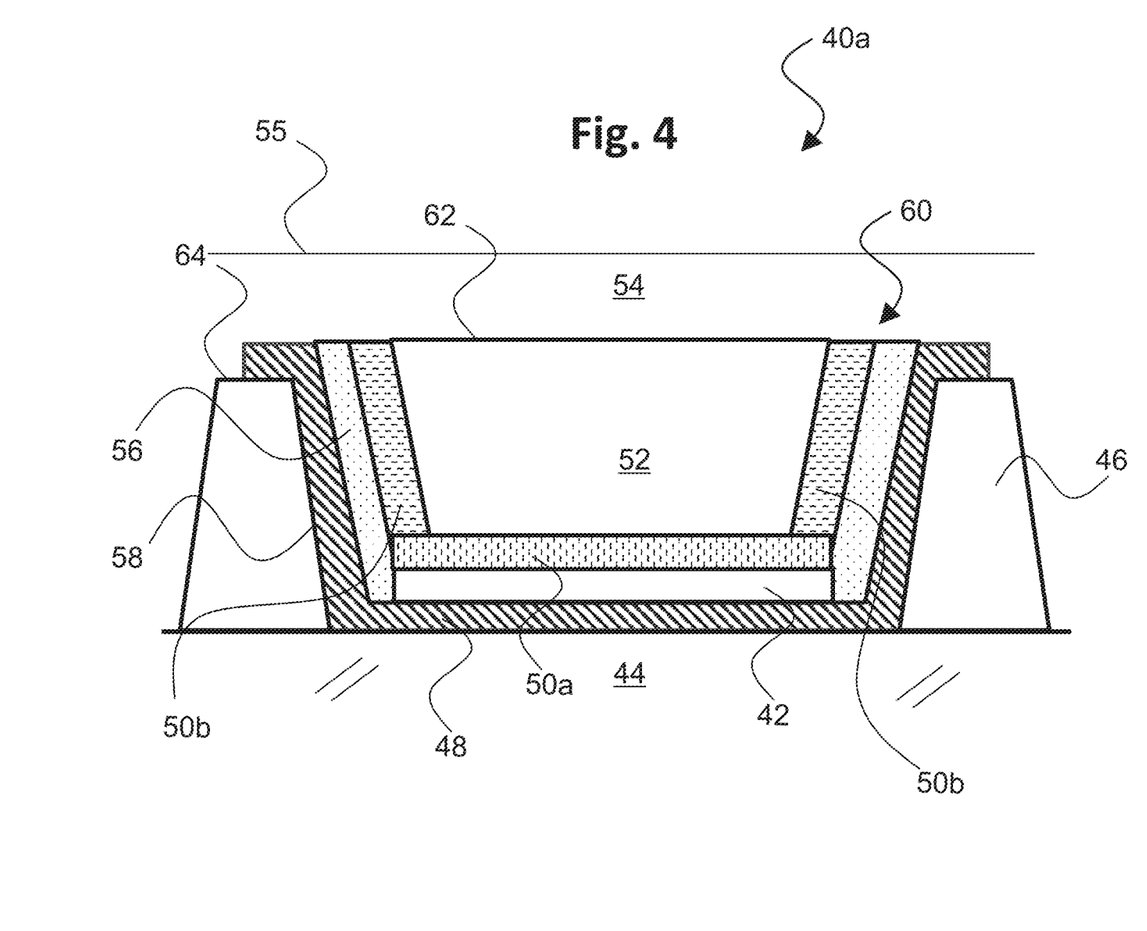
FIG. 4 is a drawing depicting a variation of the exemplary light-emitting device structure of FIG. 3, illustrating an alternative top electrode configuration.

FIG. 4 is a drawing depicting a light-emitting device structure 40a that is a variation of the exemplary light-emitting device structure of FIG. 3, illustrating an alternative second (top) electrode configuration. In the embodiment of FIG. 4, the second electrode 50 may include a first portion 50a directly adjacent to the emitting side surface of the emissive cavity 42, and a second portion 50b that extends from the first portion 50a in a direction along the slope of the bank structure 46. The properties of the first portion 50a and the second portion 50b may be different from each other. For example, the second portion 50b that extends along the bank structure slope may be a metal or other reflective material such as silver, and the first portion 50a adjacent to the emitting side surface of the emissive cavity may be a conductive layer that may not be a metal, e.g. ITO. The first (bottom) electrode 48 may be a unitary structure that is identical along the bank structure slope and adjacent to the emissive cavity structure. The second portion 50b is configured as a reflective layer to form the optical cavity 60 with the first electrode layer 48 for incident light as referenced above, in that the second portion 50b is partially reflecting allowing light to pass and be reflected from both sides. The subsequent multiple bounces of light within the optical cavity 60, and consequent transmission of light through the second portion 50b of the second electrode layer, constructively interfere to give a final reflectivity. This composition of the optical cavity including the distance between the first and second electrode layers on the bank structure, and the bank slope angle, can be selected so that for an incident angle of light onto the bank structure that is most common in the filler material layer 52, light would be preferentially and strongly reflected towards the normal of the device. Principles of the current application are applicable to both top electrode configurations depicted in FIGS. 3 and 4.

Figure 5:
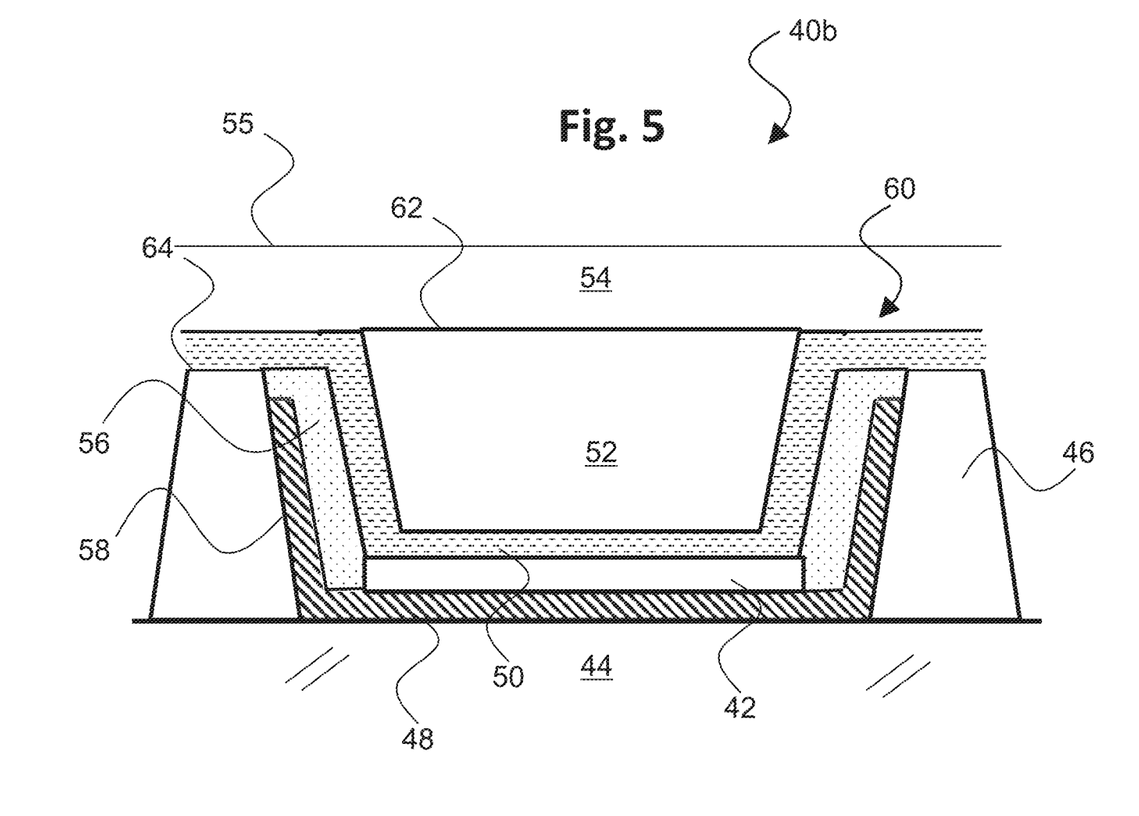
FIG. 5 is a drawing depicting a variation of the exemplary light-emitting device structure of FIG. 3, illustrating an alternative common electrode configuration.

FIG. 5 depicts a light-emitting device structure 40b that is a variation on the embodiment of FIG. 3, illustrating an alternative common electrode configuration. In the variation of FIG. 5, the second (top) electrode layer 50 extends over the sloped surface 58 of the bank structure 46, and further over the emitting side surface 64 of the bank structure 46. The second electrode layer 50 also may be further extended across an array of pixels, up to pixels of the entire display device, to act as the common electrode for the pixels. In this example, the first (bottom) electrode layer 48 is localized within the bank structure 46 relative to adjacent pixels. Principles of the current application are applicable to both the common electrode configurations depicted in FIGS. 3 and 5.

Figure 6:
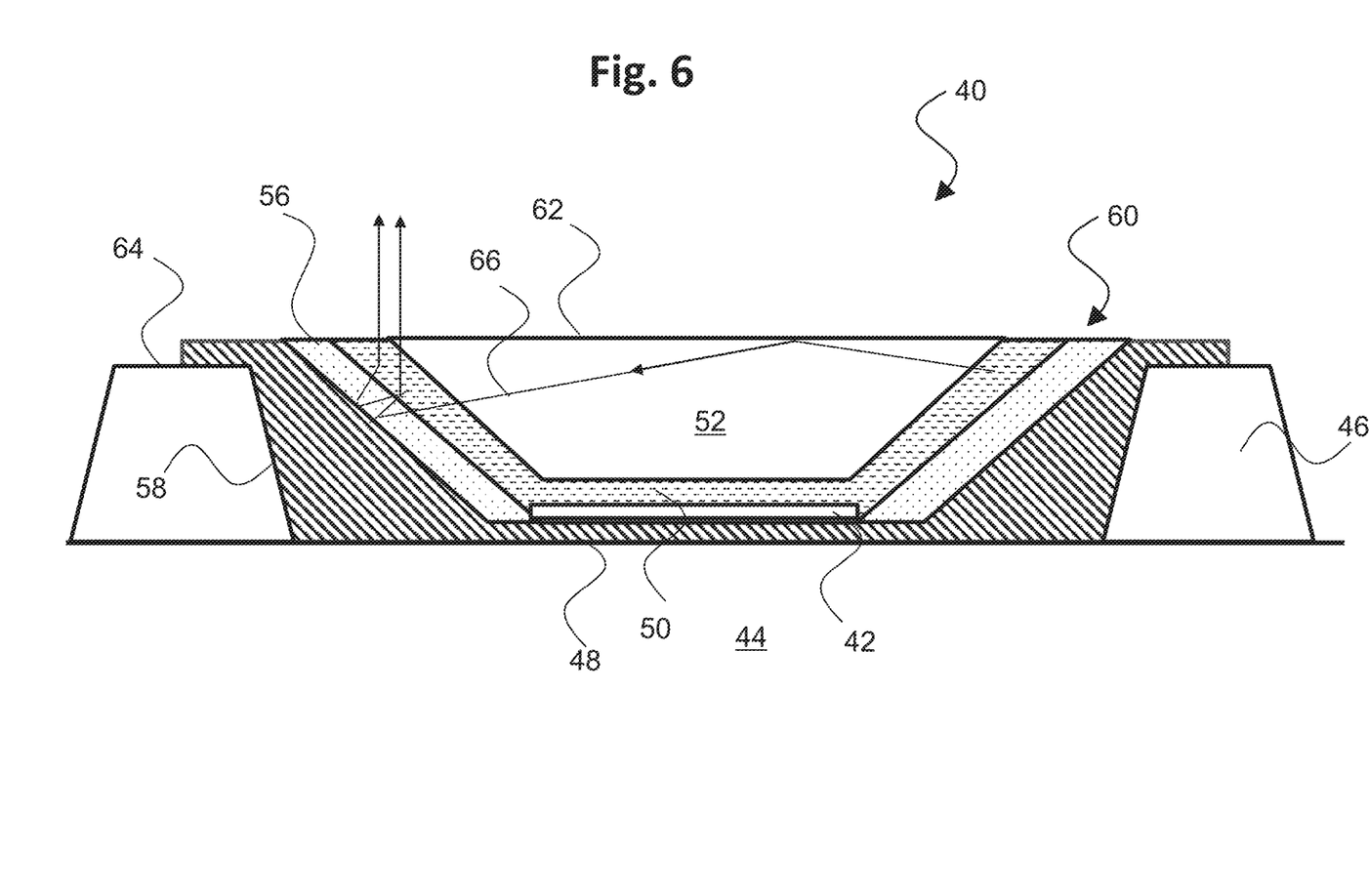
FIG. 6 is a drawing depicting the effect of the electrode configuration of FIG. 3 on light emission from the light-emitting device.

FIG. 6 is a drawing depicting the effect of the configuration of the reflective optical cavity structure 60 of FIG. 3 on light emission from the light-emitting device 40 to reduce the amount of light trapped by total internal reflection (TIR). It will be appreciated that comparable principles apply to the alternative light-emitting device 40a illustrated in FIG. 4 having the alternative top electrode configuration, and to the alternative light-emitting device 40b illustrated in FIG. 5 having the alternative common electrode configuration. The two electrode layers 48 and 50 separated by the dielectric layer 56 form the reflective optical cavity 60 whose thickness and/or shape can be controlled in design to preferentially reflect trapped light with high efficiency on axis. This can be done by designing this reflective optical cavity 60 such that the cavity creates, by constructive interference, a preferential reflection from the angles at which the trapped light is incident to the normal to the display pixel. At these angles, the phase difference for light reflected from the first and second conductive electrode layers is $2n\pi$, where n is an integer. In this manner, the electrode layers in combination with the dielectric layer create a resonant cavity that preferentially directs light from TIR angles to essentially an on-axis direction. This improves both on-axis apparent brightness and overall light output efficiency.

The configuration of the reflective optical cavity 60 operates to disrupt total internal reflection within the filler material layer 52. FIG. 6 depicts a light beam 66 that is emitted from the emissive cavity 42 and into the filler material layer 52. Light beam 66 is illustrative of off-axis light emitted from the emissive cavity 42 at an angle that in conventional configurations may undergo total internal reflection (TIR). When the light beam 66 enters the reflective optical cavity 60, the light beam undergoes one or more reflections between the first and second reflective (e.g., conductive electrode) layers 48 and 50. As referenced above, the reflective optical cavity 60 is configured as a resonant cavity in which constructive interference occurs for preferential reflection from TIR angles at which the trapped light is incident to the normal to the display pixel. Light that undergoes total internal reflection thus is reduced insofar as a greater portion of the off-axis light propagates through the reflective cavity 60 and is out-coupled from the light-emitting device 40 (or 40a/40b) for enhanced extraction in an on-axis direction. In this manner, the amount of light that is trapped by total internal reflection is reduced as compared to conventional configurations, and on-axis brightness is enhanced.

As referenced above, $SiO_2$ and $Si_3N_4$ are suitable materials for the dielectric material layer 56. More generally, suitable materials for the dielectric material layer 56 are materials having a low conductivity and a low refractive index, such as 1.0-1.4, to reduce the potential for parasitic capacitances.

Figure 7:
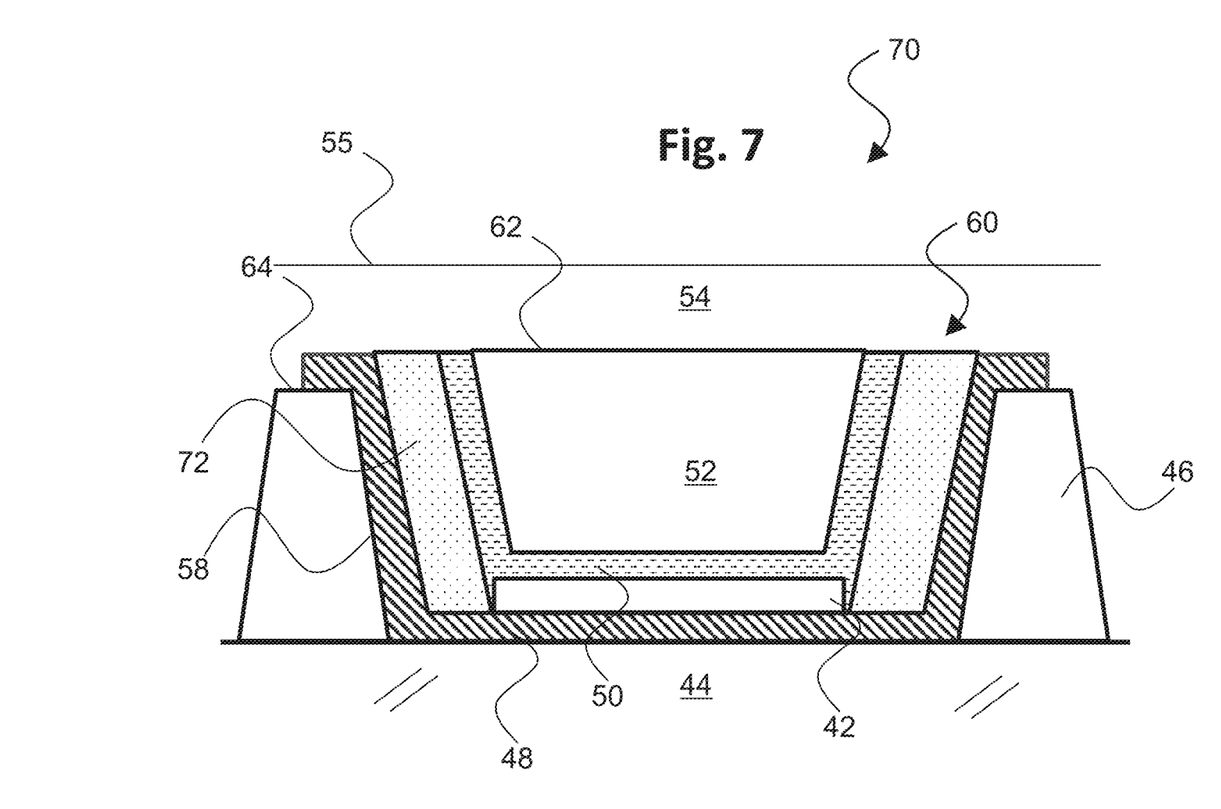
FIG. 7 is a drawing depicting another exemplary light-emitting device structure for a pixel in accordance with embodiments of the present application, using a relatively thicker dielectric material layer.

FIG. 7 is a drawing depicting another exemplary light-emitting device structure 70 for a pixel in accordance with embodiments of the present application, using a dielectric material layer 72 having a thickness in a direction between the first and second conductive layers such that a thickness of the reflective optical cavity in a direction normal to the conductive layers 48 and 50 is greater than a thickness of the emissive cavity 42 in a direction of light emission. Common components as in previous embodiments are denoted with like reference numerals. In addition, the top electrode configuration of FIG. 3 or FIG. 4, or the common electrode configuration of FIG. 3 or FIG. 5, may be employed in connection with using the thicker dielectric material layer 72 of FIG. 7.

When the reflective optical cavity structure 60 is formed using the electrode layers 48 and 50 extended from the emissive cavity structure 42 along the inner surface 58 of the bank structure 46, the increased area of the electrodes generates an increased capacitance between the electrode layers. The increased capacitance can lead to power loss and lower electrical efficiency, especially at relatively higher frequencies of the electrode driving voltage. The increased capacitance can be reduced by using a dielectric material layer of lower dielectric constant, or by using a thicker dielectric material layer 72 as illustrated in FIG. 7. With a thicker dielectric material layer 72, similarly as in previous embodiments, reflection still is tuned to the input and output angles of the emitted light, although a larger optical path is present. Accordingly, the phase change condition remains the same that a phase difference for light reflected from the first and second conductive electrode layers is $2n\pi$, although the value of "n" would be significantly higher than in previous embodiments. In general, the emissive cavity structure 42 tends to have a thickness of about one wavelength of the light to be emitted, and using a suitable thicker dielectric material layer 72 tends to result in a reflective optical cavity 60 having a thickness of about two to three times such wavelength to reduce the increased capacitance effects. Generally, to reduce capacitance effects the reflective optical cavity 60 has a thickness greater in a direction normal to the conductive layers than a thickness of the emissive cavity in a direction of light emission.

Figure 8:
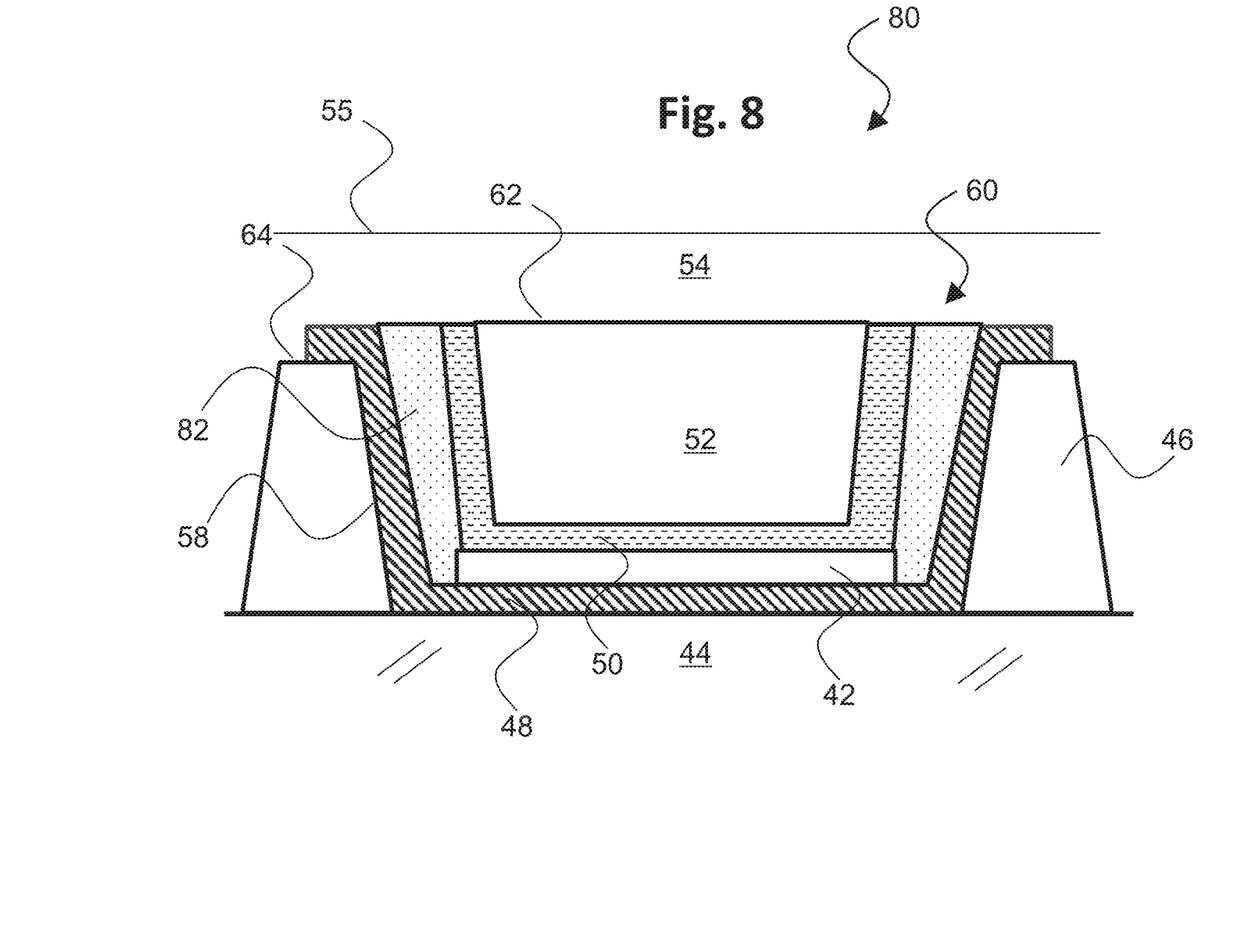
FIG. 8 is a drawing depicting another exemplary light-emitting device structure for a pixel in accordance with embodiments of the present application, using a dielectric layer of non-constant thickness.

FIG. 8 is a drawing depicting another exemplary light-emitting device structure 80 for a pixel in accordance with embodiments of the present application, using a dielectric material layer 82 having a non-constant thickness in a direction between the conductive layers. Common components as in previous embodiments are denoted with like reference numerals. In addition, the top electrode configuration of FIG. 3 or FIG. 4, or the common electrode configuration of FIG. 3 or FIG. 5, may be employed in connection with using the dielectric material layer of non-constant thickness 82 of FIG. 8.

In the example of FIG. 8, the dielectric material layer 82 has a non-constant thickness configured as a wedge shape that thickens in a direction extending farther from the emissive cavity structure 42, although other suitable thickness variations may be employed. For any given shape of varying thickness, the conductive electrode layers 48 and 50 follow a contour of the dielectric material layer 82 so as to follow the thickness variation. Using a dielectric material layer 82 of non-constant thickness may be desirable because at any position along the inner surface 58 of the bank structure 46, the range of incident angles from trapped light may vary significantly. A variation in shape of the dielectric material layer 82 maintains the optimum extraction reflection at all positions along the inner surface 58 of the bank structure 46. As an alternative, the inner surface 58 of the bank structure 46 may be shaped to account for different angles of incidence of the light, and a variation of thickness of the dielectric material layer 82 can compensate for variations in the bank structure thickness to compensate for reduction in on-axis emission and/or light output efficiency.

An aspect of the invention is a light-emitting device that has enhanced light output by employing a reflective optical cavity along the bank structure to improve light extraction. In exemplary embodiments, the light-emitting device includes a bank structure; an emissive cavity disposed within the bank structure; a filler material layer disposed within the bank structure and on a light-emitting side of the emissive cavity; and a reflective optical cavity disposed along an inner surface of the bank structure facing the filler material layer. The reflective optical cavity is configured to out-couple light that is internally reflected by an emitting side surface of the filler material layer and is incident on the reflective optical cavity. The light-emitting device may include one or more of the following features, either individually or in combination.

In an exemplary embodiment of the light-emitting device, the reflective optical cavity comprises a first conductive layer and a second conductive layer that are separated by a non-conductive dielectric layer.

In an exemplary embodiment of the light-emitting device, the first conductive layer is disposed against the inner surface of the bank structure, and the second conductive layer is disposed against the filler material layer opposite from the inner surface of the bank structure.

In an exemplary embodiment of the light-emitting device, the emissive cavity includes an emissive layer disposed between a first electrode layer and a second electrode layer, and the first conductive layer is configured as an extension of the first electrode layer and the second conductive layer is configured as an extension of the second electrode layer.

In an exemplary embodiment of the light-emitting device, the first electrode layer is disposed on a non-emitting side of the emissive layer and the second electrode layer is disposed on an emitting side of the emissive layer, and the first electrode layer extends over an emitting side surface of the bank structure.

In an exemplary embodiment of the light-emitting device, the first electrode layer is disposed on a non-emitting side of the emissive layer and the second electrode layer is disposed on an emitting side of the emissive layer, and the second electrode layer extends over an emitting side surface of the bank structure.

In an exemplary embodiment of the light-emitting device, the second electrode layer includes a first portion adjacent to a light-emitting side of the emissive layer and a second portion that extends from the first portion along the inner surface of the bank structure, and the first portion and the second portion have different properties.

In an exemplary embodiment of the light-emitting device, a phase difference for light reflected within the reflective optical cavity is $2n\pi$, where n is an integer.

In an exemplary embodiment of the light-emitting device, a thickness of the dielectric material layer in a direction between the first and second conductive layers is such that a thickness of the reflective optical cavity in a direction normal to the first and second conductive layers is greater than a thickness of the emissive cavity in a direction of light emission.

In an exemplary embodiment of the light-emitting device, the emissive cavity has a thickness in the direction of light emission of about one wavelength of light emitted by the emissive cavity, and the reflective optical cavity has a thickness in the direction between the first and second conductive layers of two to three wavelengths of light emitted by the emissive cavity.

In an exemplary embodiment of the light-emitting device, the dielectric material layer has a non-constant thickness in a direction between the first and second conductive layers.

In an exemplary embodiment of the light-emitting device, the dielectric material layer has a wedge shape that thickens in a direction farther from the emissive cavity.

In an exemplary embodiment of the light-emitting device, the dielectric material layer has a refractive index of 1.0-1.4.

In an exemplary embodiment of the light-emitting device, the filler material layer has a refractive index of 1.5 to 2.5.

In an exemplary embodiment of the light-emitting device, the emissive cavity is disposed on a substrate, and the emissive cavity is a top emitting device that emits light in a direction opposite from the substrate.

In an exemplary embodiment of the light-emitting device, the light-emitting device further includes a planarizing material layer disposed on the filler material layer and that has a refractive index that is less than a refractive index of the filler material layer.

In an exemplary embodiment of the light-emitting device, the planarizing material layer has a refractive index between 1.0 and 1.4.

In an exemplary embodiment of the light-emitting device, the planarizing material layer is air.

In an exemplary embodiment of the light-emitting device, the light-emitting device further includes a top substrate disposed on the planarizing material layer.

In an exemplary embodiment of the light-emitting device, the emissive cavity includes one of a quantum dot emissive layer or an organic emissive layer Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

The present invention relates to a layer structure used for light-emitting devices, such as for QLED and OLED displays. Hardware manufactured using this disclosure may be useful in a variety of fields that use such displays including gaming, entertainment, task support, medical, industrial design, navigation, transport, translation, education, and training.

REFERENCE SIGNS LIST

- 10—conventional cavity structure
- 12—emissive layer
- 14—first charge transport layer (e.g., HTL)
- 16—second charge transport layer (e.g., ETL)
- 18—first electrode layer
- 20—second electrode layer
- 22—substrate
- 24—first HTL component layer
- 26—second HTL component layer
- 30—light emitting device structure
- 32—bank structure
- 34—filler material layer
- 36—bank structure inner surface
- 40/40a/40b—light emitting device structure
- 42—emissive cavity
- 44—substrate
- 46—bank structure
- 47—bank structure inner surface
- 48—first conductive electrode layer
- 50—second conductive electrode layer
- 50a—first portion of second electrode layer
- 50b—second portion of second electrode layer
- 52—filler material layer
- 54—planarizing material layer
- 55—second substrate
- 56—non-conductive dielectric material layer
- 58—bank structure inner surface
- 60—reflective optical cavity
- 62—emitting side surface of filler material layer
- 64—emitting side surface of bank structure
- 66—light beam
- 70—light emitting device structure
- 72—dielectric material layer
- 80—light emitting device structure
- 82—dielectric material layer

What is claimed is:

1. A light-emitting device comprising:
a bank structure;
an emissive cavity disposed within the bank structure;
a filler material layer disposed within the bank structure and on a light-emitting side of the emissive cavity; and
a reflective optical cavity disposed along an inner surface of the bank structure facing the filler material layer, wherein the reflective optical cavity is configured to out-couple light that is internally reflected by an emitting side surface of the filler material layer and is incident on the reflective optical cavity;
wherein:
the reflective optical cavity comprises a first conductive layer and a second conductive layer that are separated by a non-conductive dielectric layer;
the emissive cavity includes an emissive layer disposed between a first electrode layer and a second electrode layer, and the first conductive layer is configured as an extension of the first electrode layer and the second conductive layer is configured as an extension of the second electrode layer; and
the second electrode layer includes a first portion adjacent to a light-emitting side of the emissive cavity and a second portion that extends from the first portion along the inner surface of the bank structure, and the first portion and the second portion have different properties.

2. The light-emitting device of claim 1, wherein the first conductive layer is disposed against the inner surface of the bank structure, and the second conductive layer is disposed against the filler material layer opposite from the inner surface of the bank structure.

3. The light-emitting device of claim 1, wherein the first electrode layer is disposed on a non-emitting side of the emissive layer and the second electrode layer is disposed on an emitting side of the emissive layer, and the first electrode layer extends over an emitting side surface of the bank structure.

4. The light-emitting device of claim 1, wherein the first electrode layer is disposed on a non-emitting side of the emissive layer and the second electrode layer is disposed on an emitting side of the emissive layer, and the second electrode layer extends over an emitting side surface of the bank structure.

5. The light-emitting device of claim 1, wherein a phase difference for light reflected within the reflective optical cavity is $2n\pi$, where n is an integer.

6. The light-emitting device of claim 1, wherein a thickness of the dielectric material layer in a direction between the first and second conductive layers is such that a thickness of the reflective optical cavity in a direction normal to the first and second conductive layers is greater than a thickness of the emissive cavity in a direction of light emission.

7. The light-emitting device of claim 6, wherein the emissive cavity has a thickness in the direction of light emission of about one wavelength of light emitted by the emissive cavity, and the reflective optical cavity has a thickness in the direction between the first and second conductive layers of two to three wavelengths of light emitted by the emissive cavity.

8. The light-emitting device of claim 1, wherein the dielectric material layer has a non-constant thickness in a direction between the first and second conductive layers.

9. The light-emitting device of claim 8, wherein the dielectric material layer has a wedge shape that thickens in a direction farther from the emissive cavity.

10. The light-emitting device of claim 1, wherein the dielectric material layer has a refractive index of 1.0-1.4.

11. The light-emitting device of claim 1, wherein the filler material layer has a refractive index of 1.5 to 2.5.

12. The light-emitting device of claim 1, wherein the emissive cavity is disposed on a substrate, and the emissive cavity is a top emitting device that emits light in a direction opposite from the substrate.

13. The light emitting device of claim 1, further comprising a planarizing material layer disposed on the filler material layer and that has a refractive index that is less than a refractive index of the filler material layer.

14. The light-emitting device of claim 13, wherein the planarizing material layer has a refractive index between 1.0 and 1.4.

15. The light-emitting device of claim 13, wherein the planarizing material layer is air.

16. The light-emitting device of claim 13, further comprising a top substrate disposed on the planarizing material layer.

17. The light-emitting device of claim 1, wherein the emissive cavity includes one of a quantum dot emissive layer or an organic emissive layer.

* * * * *